United States Patent
Honda (10) Patent No.: US 10,817,017 B2
(45) Date of Patent: Oct. 27, 2020

(54) TERMINAL DEVICE

(71) Applicant: FUJITSU CLIENT COMPUTING LIMITED, Kawasaki-shi, Kanagawa (JP)

(72) Inventor: Masao Honda, Kawasaki (JP)

(73) Assignee: FUJITSU CLIENT COMPUTING LIMITED (JP)

( * ) Notice: Subject to any disclaimer, the term of this patent is extended or adjusted under 35 U.S.C. 154(b) by 0 days.

(21) Appl. No.: 16/280,352

(22) Filed: Feb. 20, 2019

(65) Prior Publication Data
US 2019/0179365 A1 Jun. 13, 2019

Related U.S. Application Data

(63) Continuation of application No. PCT/JP2017/037422, filed on Oct. 16, 2017.

(30) Foreign Application Priority Data

Oct. 25, 2016 (JP) ................. 2016-208714

(51) Int. Cl.
*G06F 1/16* (2006.01)
*H05K 5/03* (2006.01)
(Continued)

(52) U.S. Cl.
CPC .............. *G06F 1/162* (2013.01); *F16C 11/04* (2013.01); *G06F 1/1681* (2013.01);
(Continued)

(58) Field of Classification Search
CPC ...... G06F 1/162; G06F 1/1681; G06F 1/1683; G06F 1/16; H05K 5/02; H05K 5/0226;
(Continued)

(56) References Cited

U.S. PATENT DOCUMENTS 6,883,206 B2* 4/2005 Yang ................ G06F 1/162
16/337
6,912,122 B2* 6/2005 Chen ................ G06F 1/162
248/917
(Continued)

FOREIGN PATENT DOCUMENTS

JP 2005-295213 A 10/2005
JP 2010-242976 A 10/2010
(Continued)

OTHER PUBLICATIONS

International Search Report for Patent Application No. PCT/JP2017/037422 dated Nov. 14, 2017 (2 pages).

*Primary Examiner* — Hoa C Nguyen
*Assistant Examiner* — Keith DePew
(74) *Attorney, Agent, or Firm* — Harness, Dickey & Pierce, P.L.C.

(57) ABSTRACT

In a structure in which a main body housing and a display housing are connected by a swivel shaft and a tilt shaft, reduction in the strength of the tilt shaft is prevented. The present invention has a swivel shaft 36 that has a through hole 36H intersecting a first surface of the main body housing in an axial direction, and a tilt shaft 38 that has a groove 38M positioned continuously from the through hole 36H in a horizontal direction and is disposed so as to avoid the through hole 36H of the swivel shaft 36. A cable that electrically connects the main body housing to the display housing is disposed in the through hole 36H and the groove 38M.

6 Claims, 11 Drawing Sheets

(51) Int. Cl.
  *H05K 5/02* (2006.01)
  *F16C 11/04* (2006.01)
(52) U.S. Cl.
  CPC ......... *G06F 1/1683* (2013.01); *H05K 5/0226* (2013.01); *H05K 5/0247* (2013.01); *H05K 5/03* (2013.01)
(58) Field of Classification Search
  CPC ......... H05K 5/0247; H05K 5/03; H04M 1/02; F16C 11/04
  See application file for complete search history.

(56) References Cited

U.S. PATENT DOCUMENTS

| | | | | |
|---|---|---|---|---|
| 7,100,876 | B2* | 9/2006 | Tseng | G06F 1/162 248/125.9 |
| 7,113,397 | B2* | 9/2006 | Lee | G06F 1/162 248/919 |
| 7,308,733 | B2* | 12/2007 | An | H04M 1/0212 16/367 |
| 7,345,871 | B2* | 3/2008 | Lev | G06F 1/162 16/327 |
| 7,619,879 | B2* | 11/2009 | Aoyama | G06F 1/1613 248/920 |
| 8,161,604 | B2* | 4/2012 | Lin | G06F 1/1681 16/337 |
| 8,689,405 | B2* | 4/2014 | Yu | E05D 3/10 16/367 |
| 9,383,779 | B2* | 7/2016 | Abe | G06F 1/1643 |
| 9,501,106 | B2* | 11/2016 | Senatori | G06F 1/162 |
| 2004/0008477 | A1* | 1/2004 | Tseng | F16M 11/126 361/679.06 |
| 2005/0060843 | A1* | 3/2005 | Hung | G06F 1/162 16/367 |
| 2005/0207104 | A1* | 9/2005 | Love | G06F 1/162 361/679.07 |
| 2006/0203440 | A1* | 9/2006 | Lev | G06F 1/162 361/679.27 |
| 2006/0282985 | A1* | 12/2006 | Lu | G06F 1/162 16/367 |
| 2007/0138363 | A1* | 6/2007 | Hung | G06F 1/1679 248/291.1 |
| 2007/0285883 | A1* | 12/2007 | Nakajima | G06F 1/162 361/679.27 |
| 2009/0009950 | A1* | 1/2009 | Hattori | G06F 1/162 361/679.27 |

FOREIGN PATENT DOCUMENTS

| | | |
|---|---|---|
| JP | 2012-181799 A | 9/2012 |
| JP | 2012181799 A * | 9/2012 |
| WO | WO-2007/102213 A1 | 9/2007 |

* cited by examiner

TERMINAL DEVICE

This application is a continuation application based on a PCT International Application No. PCT/JP2017/037422, filed on Oct. 16, 2017, whose priority is claimed on Japanese Patent Application No. 2016-208714, filed Oct. 25, 2016. The entire contents of both the PCT International Application and the Japanese Application are incorporated herein by reference.

FIELD OF THE INVENTION

The technology disclosed in the present application relates to a terminal device.

DESCRIPTION OF RELATED ART

There is a folding electronic apparatus which includes an opening/closing shaft playing a pivotal role in an opening/closing operation of a first housing and a second housing and a rotating shaft playing a pivotal role in a rotating operation in a state in which the first housing and the second housing are open, in which the center line of the rotating shaft is laterally deviated with respect to the center line of the opening/closing shaft (Japanese Unexamined Patent Application, First Publication No. 2005-295213).

In addition, there is a 2-shaft hinge which includes two horizontal shaft parts and a single vertical shaft part, in which the center line of the vertical shaft part is positioned inclined from the center lines of the horizontal shaft parts (Japanese Unexamined Patent Application, First Publication No. 2010-242976).

SUMMARY OF THE INVENTION

When a terminal device employs a structure in which a display housing is connected to a main body housing using a 2-shaft hinge member, the display housing can be superposed on the main body housing with a display being outside. Specifically, this structure is a structure including a tilt shaft that connects the display housing to the main body housing such that the display housing can be opened and closed and a swivel shaft through which the display housing rotates around a center of rotation perpendicular to the main body housing in a state in which the display housing is open with respect to the main body housing, for example.

In such a terminal device using a 2-shaft hinge member, a main body housing and a display housing can be electrically connected through a cable. For example, a structure in which a through hole penetrating a swivel shaft in the axial direction is formed in the swivel shaft and a cable is wired along a tilt shaft disposed above the swivel shaft may be conceived. However, in this structure, the strength of the tilt shaft decreases when a groove for allowing the cable to be disposed therein is formed on the tilt shaft or a penetration part for allowing the cable to penetrate from the groove to the through hole of the swivel shaft is formed on the tilt shaft. Even when the tilt shaft is disposed shifted from the swivel shaft in a horizontal direction, if the aforementioned penetration part is formed in the tilt shaft, the tilt shaft is partially narrowed and thus the strength of the tilt shaft decreases.

An object of an aspect of a technology disclosed in the present application is to prevent reduction in the strength of a tilt shaft in a structure in which a main body housing and a display housing are connected through a swivel shaft and a tilt shaft.

The technology disclosed in the present application has a swivel shaft which intersects a first surface of a main body housing and has a through hole in an axial direction, and a tilt shaft which has a groove positioned continuously from the through hole in a horizontal direction and is disposed so as to avoid the through hole of the swivel shaft. A cable which electrically connects the main body housing to a display housing is disposed in the through hole and the groove.

BRIEF DESCRIPTION OF THE INVENTION

A computer that is an example of a terminal device of a first embodiment will be described in detail with reference to the drawings.

Figure 1:
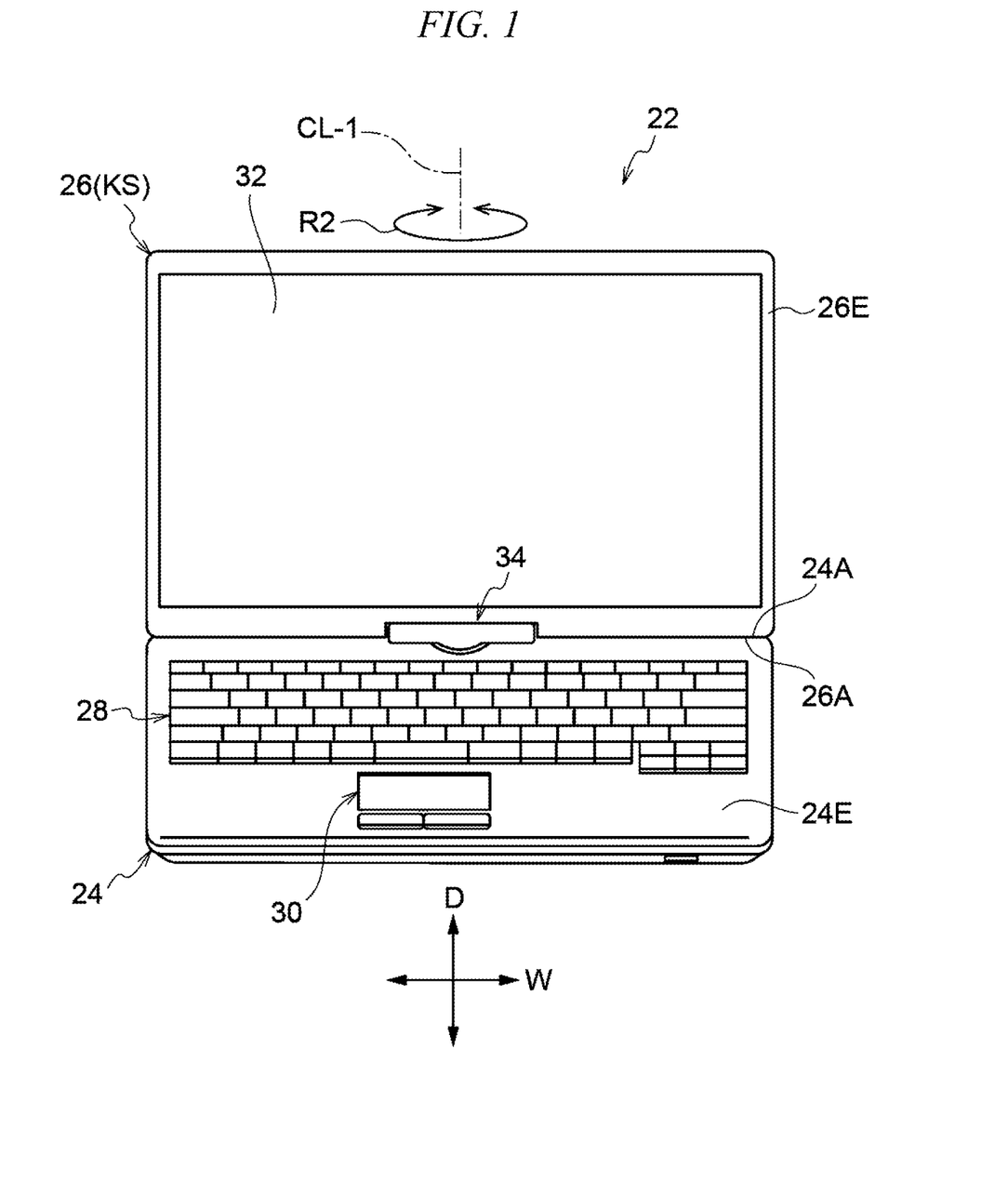
FIG. 1 is a front view showing a computer that is an example of a terminal device of a first embodiment.
Figure 2:
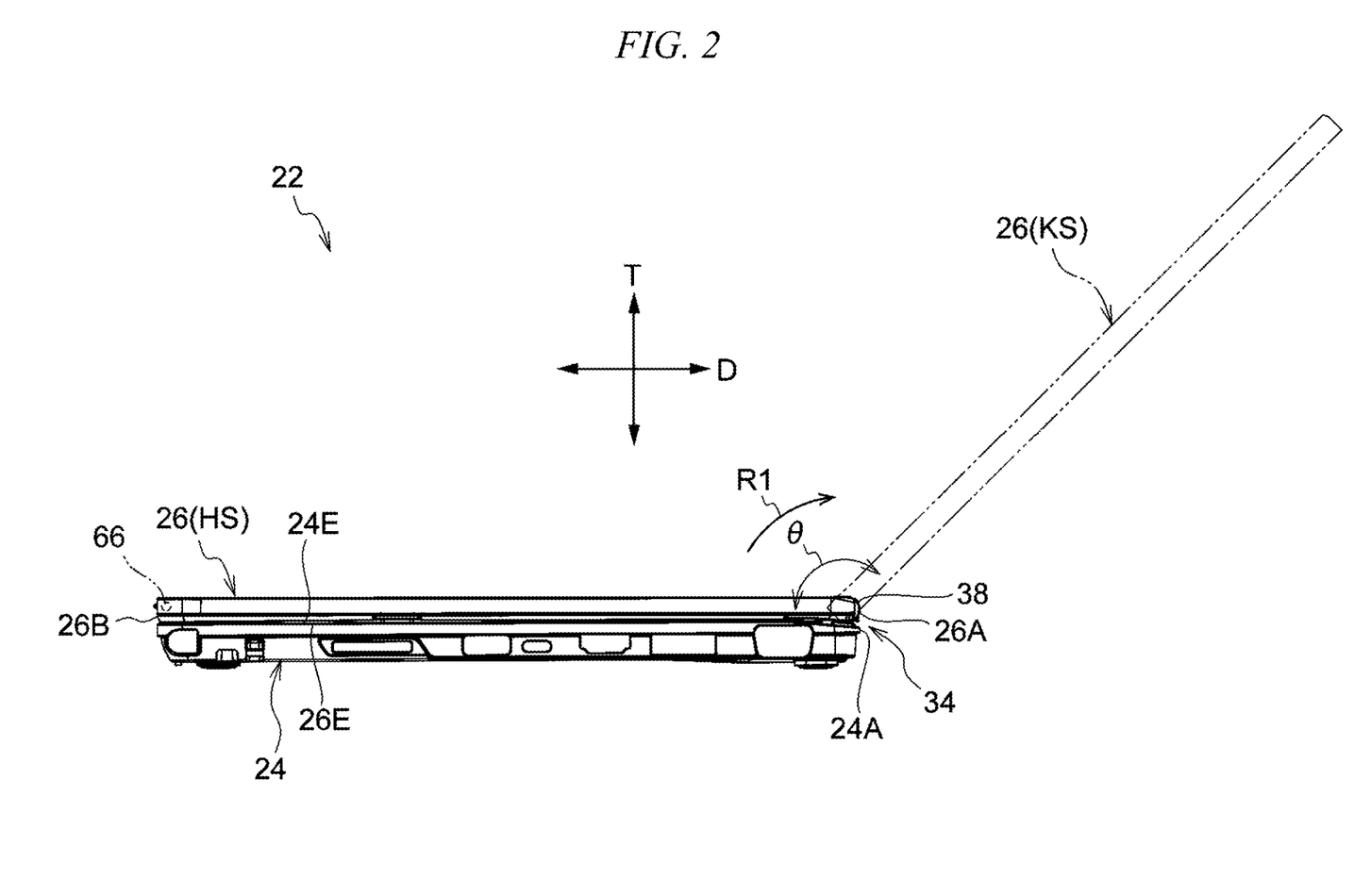
FIG. 2 is a side view showing the computer that is an example of the terminal device of the first embodiment.

As shown in FIG. 1 and FIG. 2, the computer 22 of the first embodiment has a main body housing 24 and a display housing 26. In the present embodiment, a processor, a memory, etc. are included in the main body housing 24 and the main body housing 24 serves as a main body of the computer.

In the figures, the width direction, the depth direction and the thickness direction of the main body housing 24 are indicated by arrows W, D and T.

The surface of one side of the main body housing 24 is an operation surface 24E. The operation surface 24E is an example of the first surface. As shown in FIG. 1, the operation surface 24E includes a keyboard 28 and a touch pad 30.

The surface of one side of the display housing 26 is a display surface 26E. As shown in FIG. 1, the display surface 26E includes a display 32.

The main body housing 24 and the display housing 26 are rotatably connected through a hinge member 34. Specifically, the hinge member 34 is provided to connect the inner side 24A of the main body housing 24 to the bottom side 26A of the display housing 26. The inner side 24A of the main body housing 24 is an example of a first side.

In the present embodiment, the display housing 26 can employ a state in which the display surface 26E is superposed on and faces (faces the inside) the operation surface 24E with respect to the main body housing 24, as represented by a solid line in FIG. 2. This state is referred to as a closed state HS in the following.

In addition, the display housing 26 rotates around a tilt shaft 38 which will be described later in the closed state HS, as represented by an arrow R1 in FIG. 2. Here, an angle of the display housing 26 measured from the main body housing 24 having the tilt shaft 38 as a center is referred to as an opening/closing angle θ. As represented by a two dots-dashed line in FIG. 2, a state in which the open/closing angle θ of the display housing 26 is in the range of 90 degrees to 180 degrees, for example, is suitable for using the computer 22 as a laptop computer. This state is referred to as an open state KS in the following. In the open state KS, the inner side 24A of the main body housing 24 is parallel to the bottom side 26A of the display housing 26.

Figure 3:
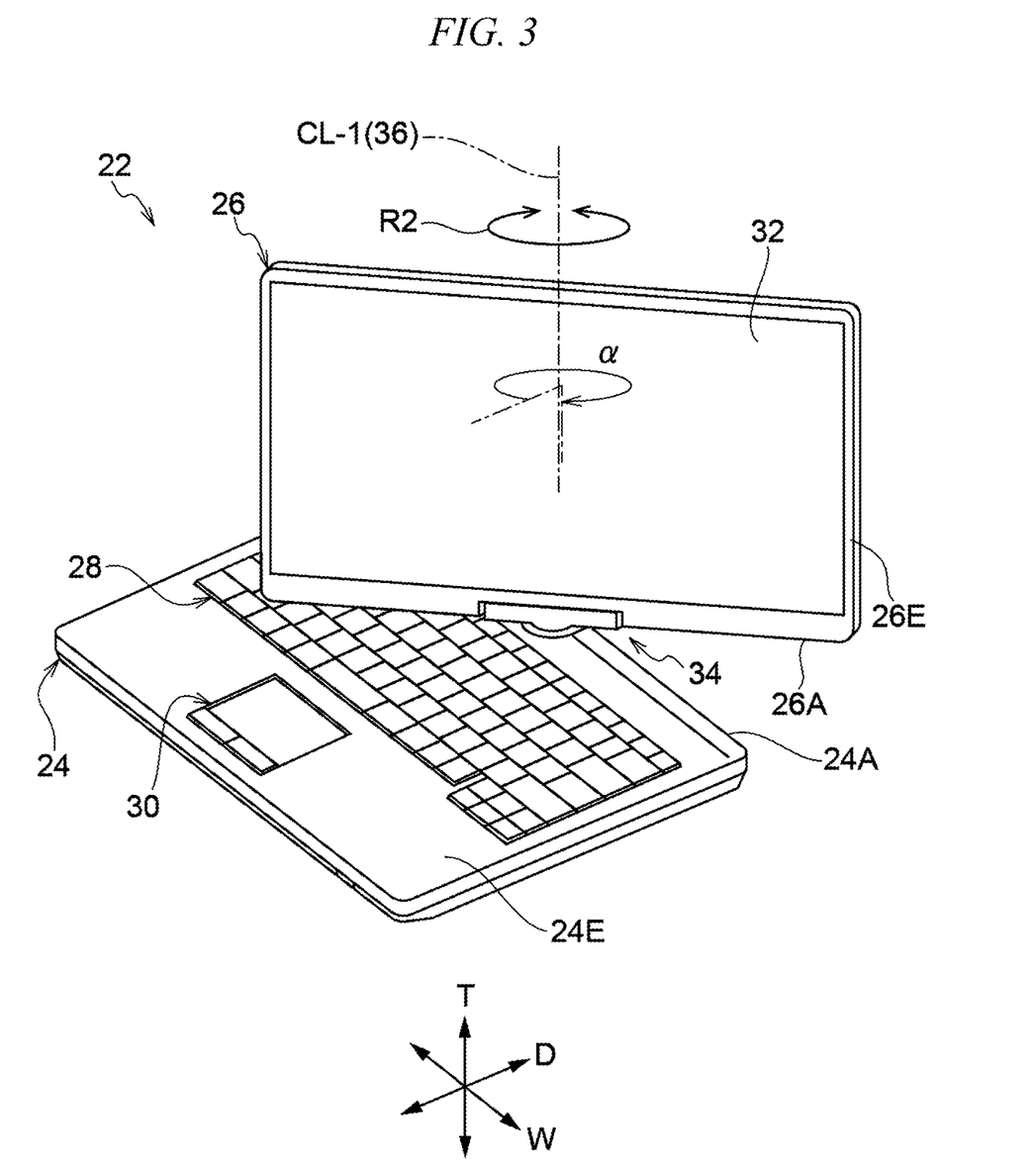
FIG. 3 is a perspective view showing the computer that is an example of the terminal device of the first embodiment.

Further, the display housing 26 rotates around a swivel shaft 36 which will be described later, as represented by an arrow R2 in FIG. 3. An angle of the display housing 26 measured in the open state KS having the swivel shaft 36 as a center is referred to as a rotation angle α (clockwise direction when the main body housing 24 is viewed above is positive). As shown in FIG. 1, α=0 degrees in the open state KS. In addition, the display housing 26 can be rotated around the swivel shaft 36 in the direction of the arrow R2.

Figure 4:
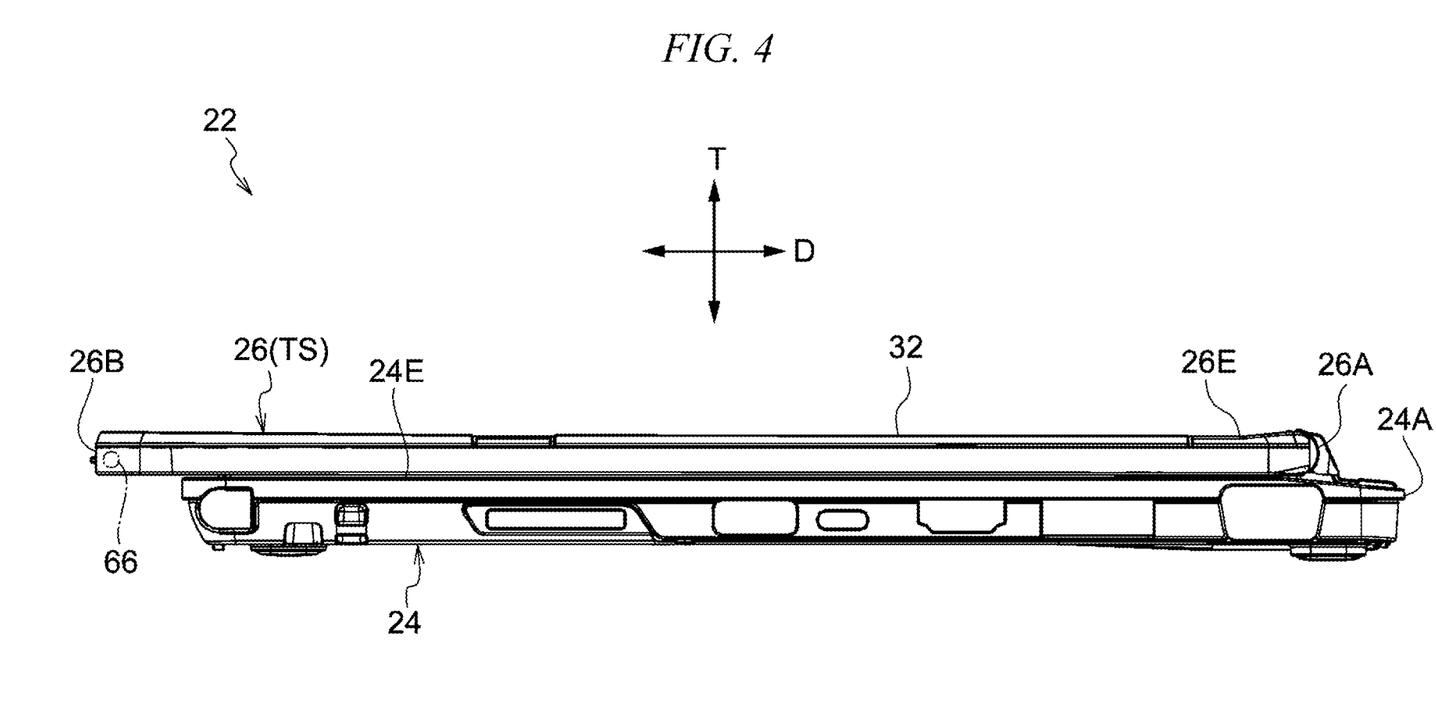
FIG. 4 is a side view showing the computer that is an example of the terminal device of the first embodiment.

Further, a state in which α=180 degrees can be employed by rotating the display housing 26 in the direction of the arrow R2. Further, in this state, the display housing 26 can be rotated around the tilt shaft 38 in a direction opposite to the arrow R1 of FIG. 1 to employ a state in which the display surface 26E is superposed on and faces the reverse of the operation surface 24E (faces the outside), as shown in FIG. 4. This state of the display housing 26 is referred to as a tablet state TS in the following.

Figure 5:
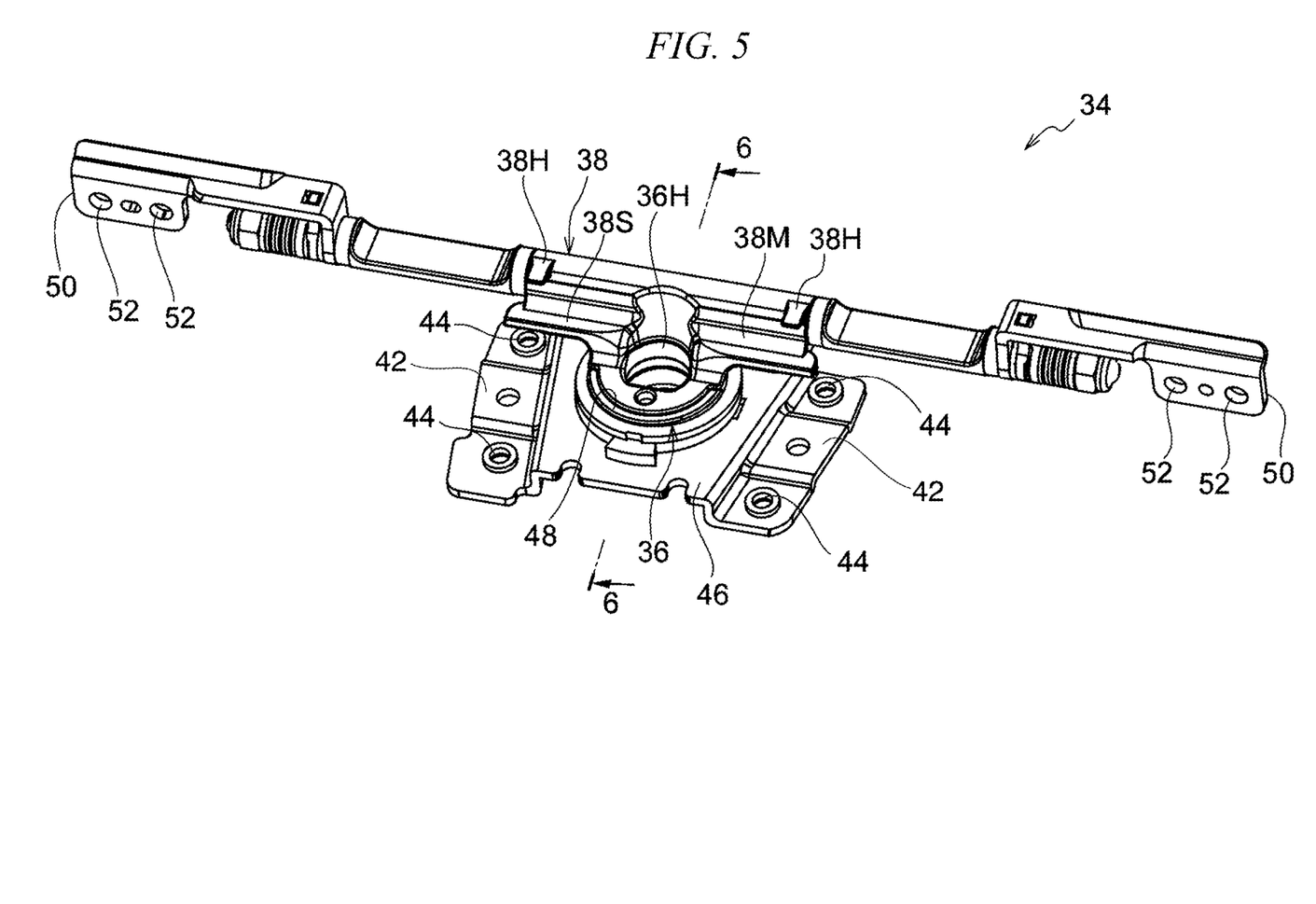
FIG. 5 is a perspective view showing a hinge member of the computer that is an example of the terminal device of the first embodiment.

As shown in FIG. 5, the hinge member 34 has a fixing plate 42 attached to the main body housing 24. Fixing holes 44 are formed at both sides of the fixing plate 42 in the width direction. For example, fixing screws and the like can penetrate the fixing holes 44 to fix the fixing plate 42 to the main body housing 24.

The center portion of the fixing plate 42 in the width direction is a mount portion 46 located higher than both sides in the width direction. A swivel hole 48 is formed at the center of the mount portion 46. The swivel shaft 36 is rotatably accommodated in the swivel hole 48.

Figure 6:
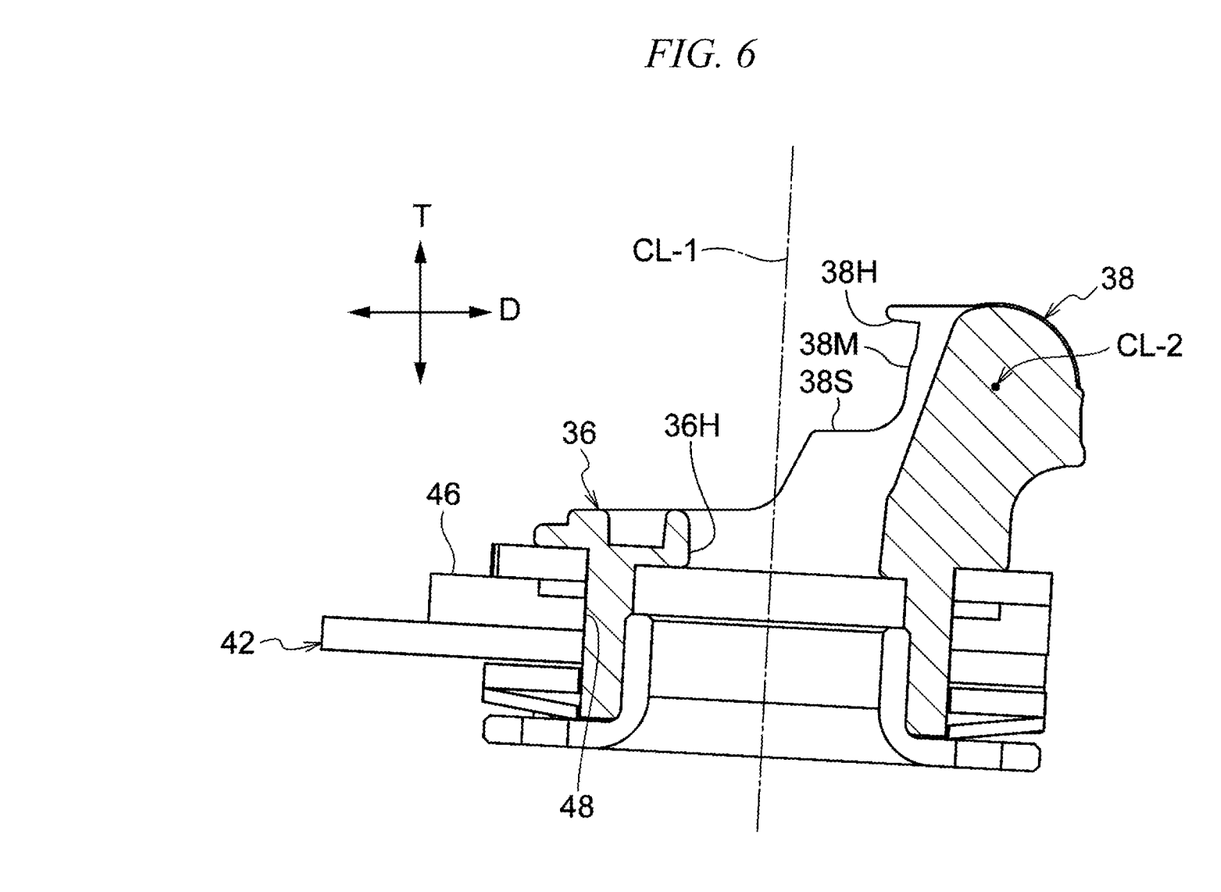
FIG. 6 is a cross-sectional view taken along line 6-6 of FIG. 5 showing the hinge member of the computer that is an example of the terminal device of the first embodiment.
Figure 7:
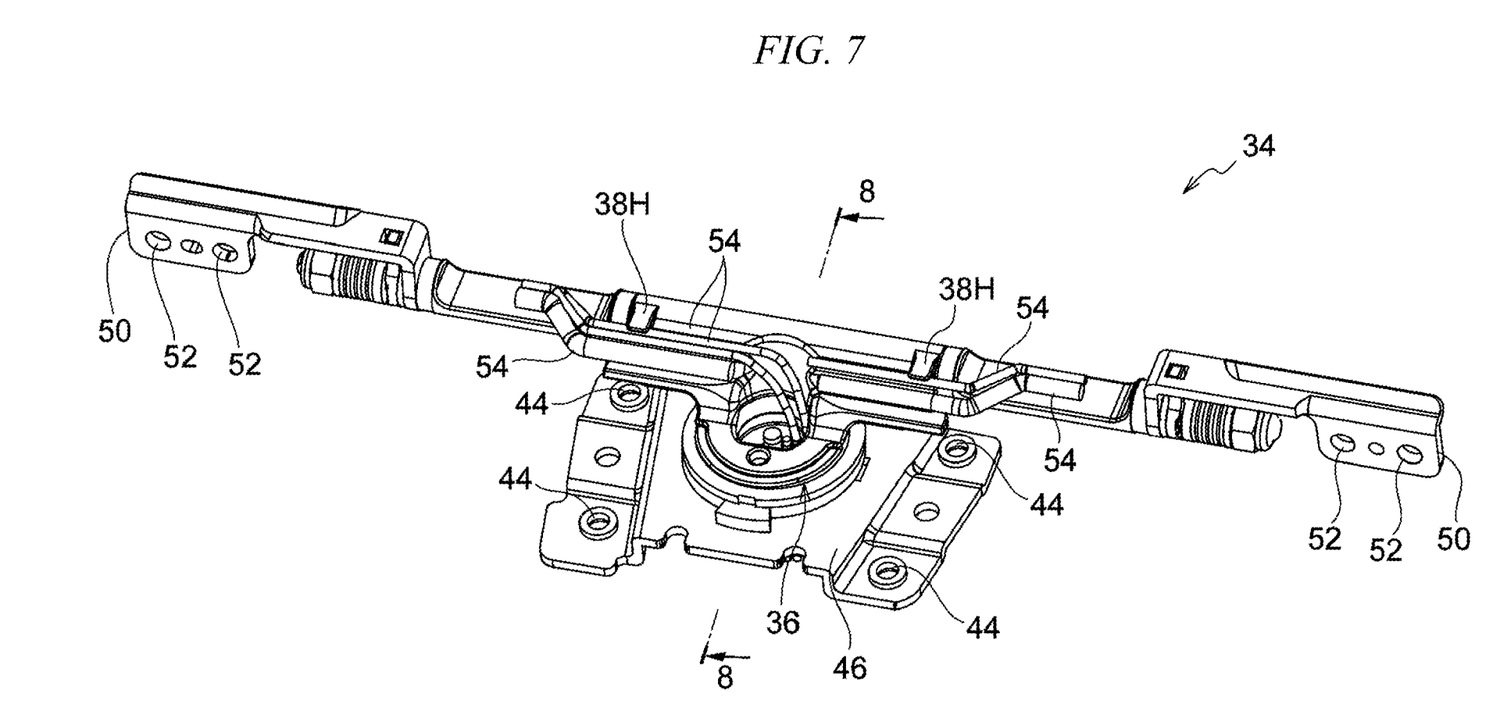
FIG. 7 is a perspective view showing the hinge member and a cable of the computer that is an example of the terminal device of the first embodiment.

As shown in FIG. 6 and FIG. 7, the tilt shaft 38 is provided on the swivel shaft 36. In the present embodiment, the swivel shaft 36 and the tilt shaft 38 are formed by being integrated with each other. The tilt shaft 38 is a rod-shaped member extending from the swivel shaft 36 in two directions.

A mounting plate 50 is attached near both ends of the tilt shaft 38 in the longitudinal direction such that the mounting plate 50 can rotate around the tilt shaft 38. Mounting holes 52 are formed in the mounting plate 50. For example, mounting screws and the like penetrate the mounting holes 52 to attach the display housing 26 to the mounting plate 50. The display housing 26 can rotate on the tilt shaft 38 in the direction of the arrow R1 shown in FIG. 2 and the opposite direction.

As shown in FIG. 6, the shaft center CL-2 of the tilt shaft 38 is deviated from the shaft center CL-1 of the swivel shaft 36 to the side of the inner side 24A. That is, the shaft center CL-2 of the tilt shaft 38 and the shaft center CL-1 of the swivel shaft 36 are in a relationship of "skew position." Accordingly, when the tilt shaft 38 rotates around the swivel shaft 36 (in the direction of the arrow R2) by 180 degrees, the tilt shaft 38 is positioned at the front side 24B.

As shown in FIG. 5 and FIG. 6, a through hole 36H penetrating in the axial direction is formed at a position including the shaft center CL-1 in the swivel shaft 36.

Figure 8:
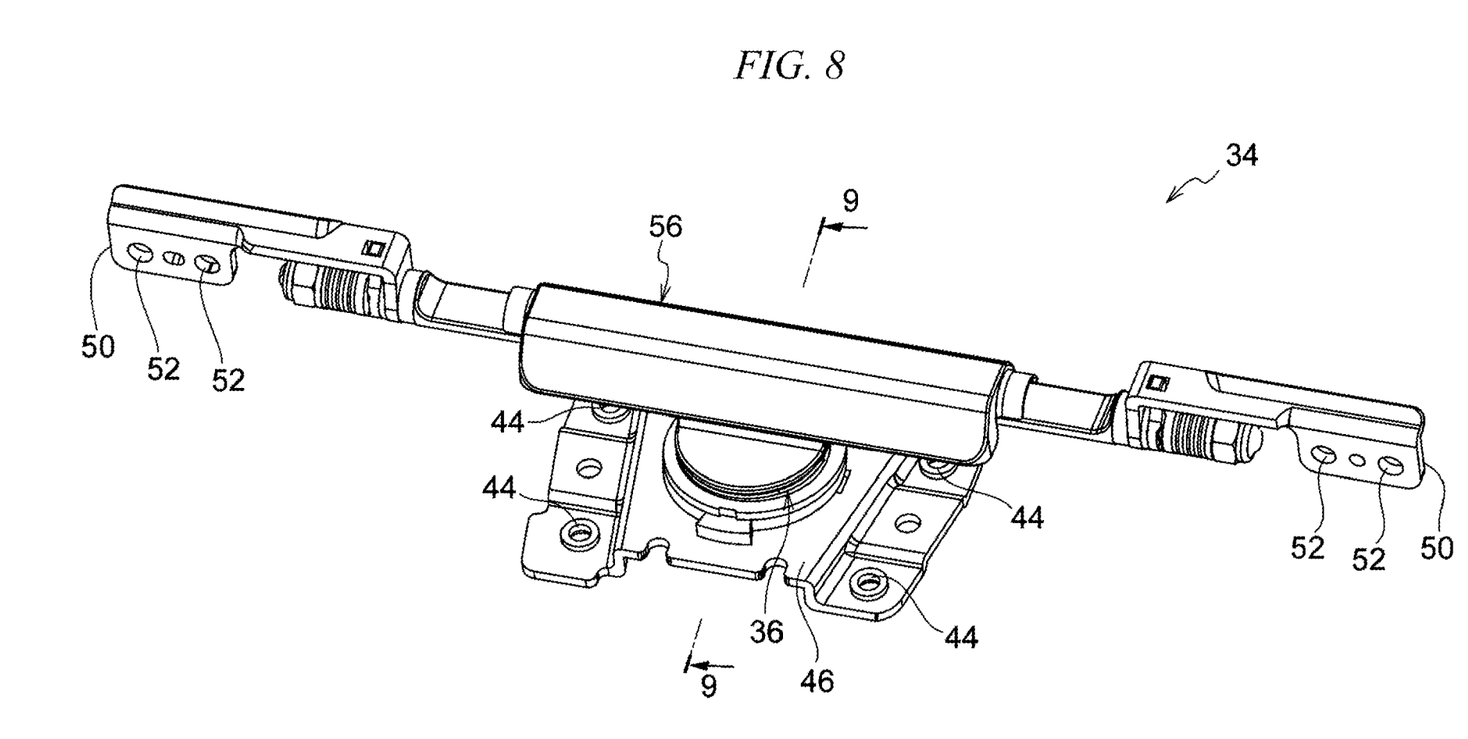
FIG. 8 is a perspective view showing the hinge member and a cover member of the computer that is an example of the terminal device of the first embodiment.

A groove 38M is formed continuously to the through hole 36H in the horizontal direction at the center of the tilt shaft 38 in the axial direction. As shown in FIG. 7 and FIG. 8, a cable 54 that electrically connects the main body housing 24 to the display housing 26 is disposed in the through hole 36H and the groove 38M.

The groove 38M has a supporting surface 38S that supports the cable 54 from below. In the present embodiment, the supporting surface 38S is formed over the range of the entire tilt shaft 38 in the axial direction in the groove 38M.

The groove 38M has holding pieces 38H that hold the cable 54 from above. In the present embodiment, two holding piece 38H are separately formed in the width direction of the tilt shaft 38 in the groove 38M. The two holding pieces 38H are at symmetrical positions with respect to the shaft center CL-1 of the swivel shaft 36.

Figure 9:
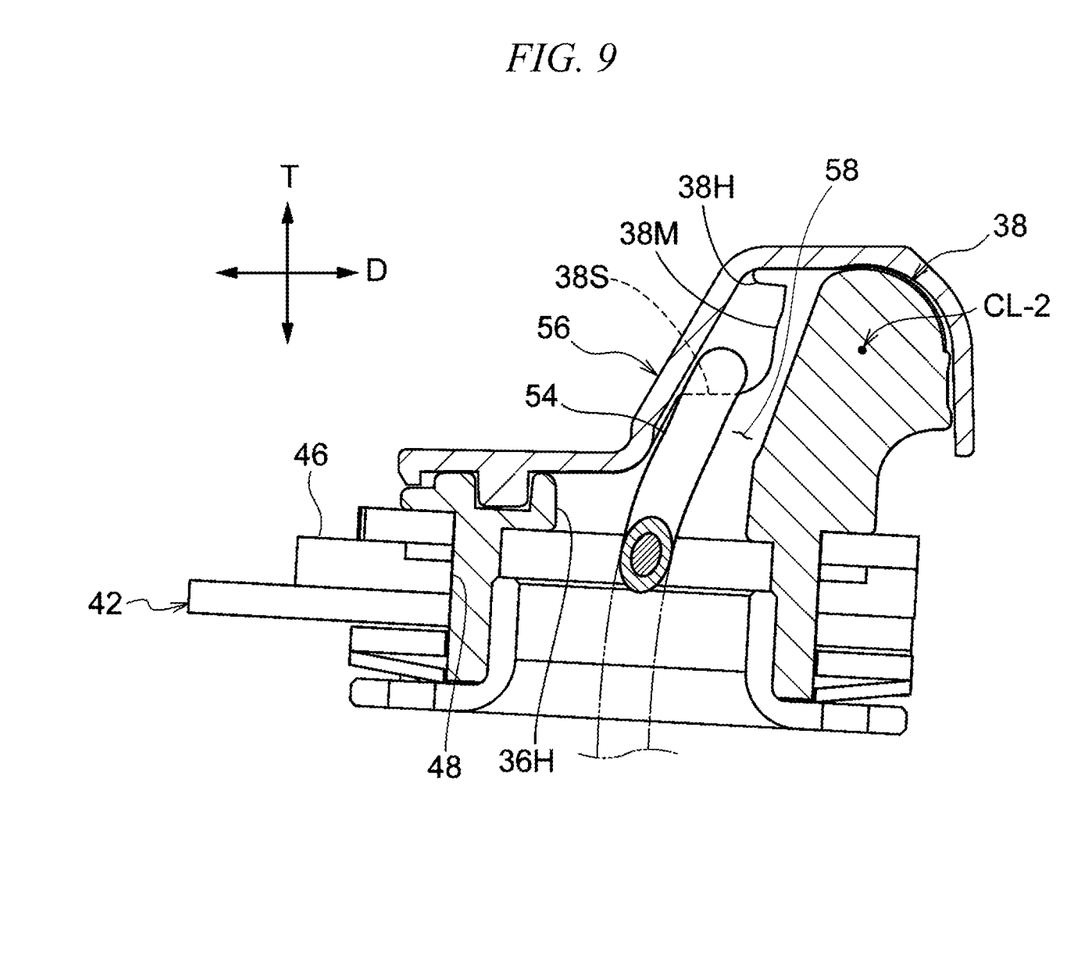
FIG. 9 is a cross-sectional view taken along line 9-9 of FIG. 8 showing the hinge member and the cover member of the computer that is an example of the terminal device of the first embodiment.

As shown in FIG. 8 and FIG. 9, a cover member 56 is placed from above the tilt shaft 38 in a state in which the cable 54 is disposed in the through hole 36H of the swivel shaft 36 and the groove 38M of the tilt shaft 38. That is, a space 58 for the cable 54 to path through is formed between the tilt shaft 38 and the cover member 56.

As shown in FIG. 2, an antenna 66 is disposed at a position near an upper side 26B inside the display housing 26. The computer 22 transmits/receives radio waves to/from external apparatuses through the antenna 66.

Next, the operation of the present embodiment will be described.

As shown in FIG. 2, in the computer 22 of the present embodiment, the display housing 26 in the closed state HS can be rotated on the tilt shaft 38 in the direction of the arrow R1. When the display housing 26 is in the open state KS, as represented by the two dots-dashed line in FIG. 2, a user of the computer 22 can easily operate the keyboard 28 or the touch pad 30 while visually checking the display 32.

When the display housing 26 is in the open state KS in this manner, the display housing 26 can be rotated on the swivel shaft 36.

In the closed state HS of the display housing 26, the tilt shaft 38 is disposed at a position nearer the inner side 24A (first side) of the main body housing 24 with respect to the swivel shaft 36. In addition, the tilt shaft 38 is also disposed at a position nearer the inner side 24A (first side) of the main body housing 24 with respect to the swivel shaft 36 in the open state KS of the display housing 26.

Accordingly, in a state in which the display housing 26 has rotated on the swivel shaft 36 by 180 degrees from the open state KS, the tilt shaft 38 has moved to the front side 24B of the main body housing 24. Further, the orientation of the display 32 has been reversed in the display housing 26.

In this state, the display housing 26 can be rotated on the tilt shaft 38 in a direction opposite to the direction of the arrow R1 in FIG. 2. Then, the display housing 26 can be superposed on the main body housing 24 in a state in which the display 32 is facing outside, that is, in a tablet state TS, as shown in FIG. 4.

A part of the upper side 26B of the display housing 26 in the tablet state protrudes to outside of the main body housing 24 when viewed in the direction normal to the main body housing 24. Since the antenna 66 is disposed at a position near the upper side 26B, it is difficult for the main body housing 24 to shield radio waves transmitted/received through the antenna 66 and thus deterioration of the sensitivity of the antenna 66 can be prevented.

As shown in FIG. 7 and FIG. 9, the cable 54 is disposed in the through hole 36H of the swivel shaft 36 and the groove 38M of the tilt shaft 38. The main body housing 24 and the display housing 26 can be electrically connected through the cable 54.

Since the groove 38M of the tilt shaft 38 is formed in the horizontal direction of the tilt shaft 38, the tilt shaft 38 can be disposed at a position at which the shaft center CL-2 of the tilt shaft 38 has deviated from the shaft center CL-1 of the swivel shaft 36. Accordingly, a structure in which the groove 38M continues to the through hole 36H can be realized.

Figure 10:
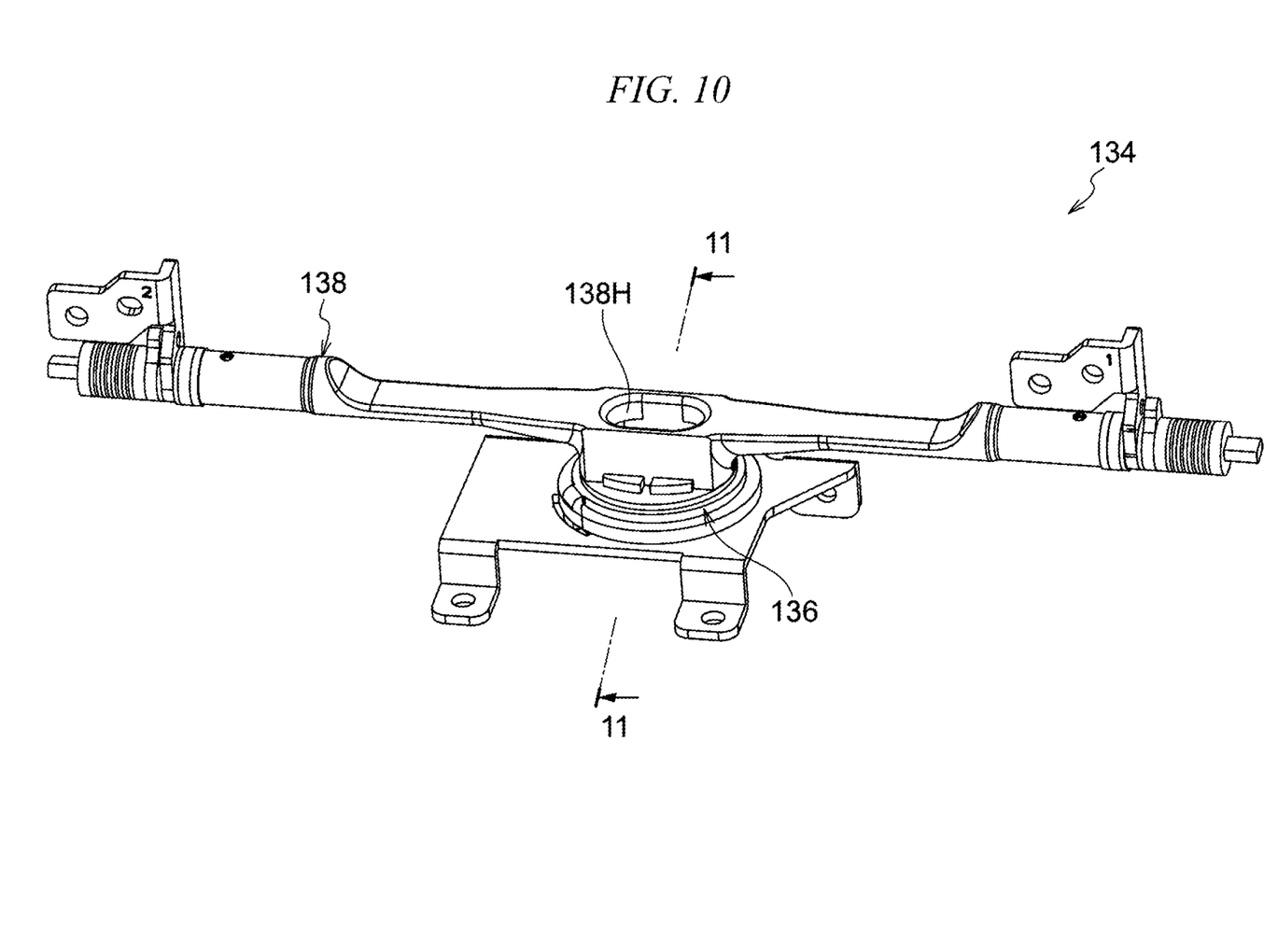
FIG. 10 is a perspective view showing a hinge member of a comparative example.
Figure 11:
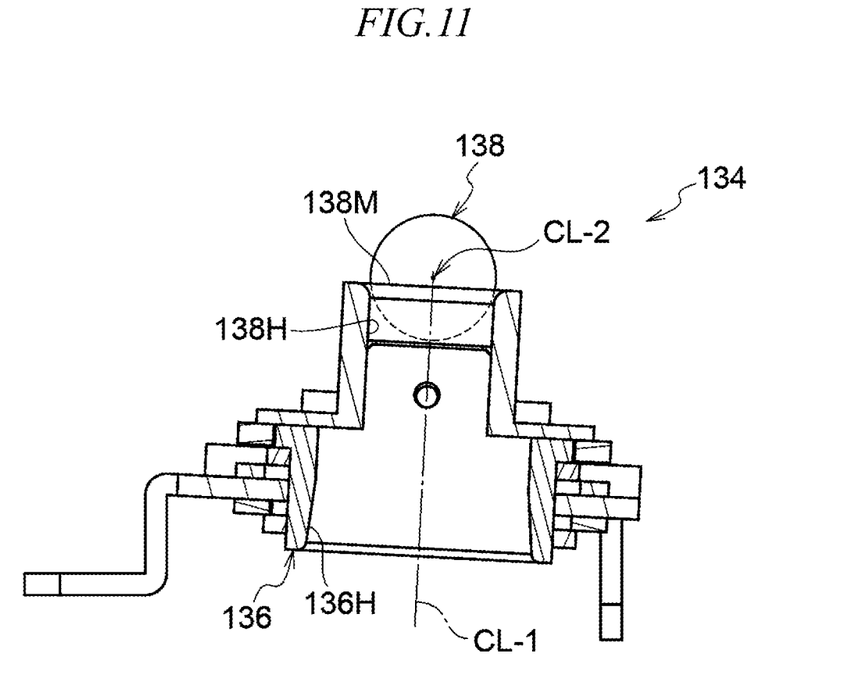
FIG. 11 is a cross-sectional view taken long line 11-11 of FIG. 10 showing the hinge member of the comparative example.

Here, FIG. 10 shows a hinge member 134 in a terminal device of a comparative example. In the hinge member 134 of the comparative example, a tilt shaft 138 is disposed right on a swivel shaft 136 and the shaft center CL-2 of the tilt shaft 138 intersects the shaft center CL-1 of the swivel shaft 136. A groove 138M for disposing a cable 54 is formed in the tilt shaft 138 from above. Further, a through hole 138H for communicating the groove 138M with a through hole 136H of the swivel shaft 136 is formed in the tilt shaft 138 and vertically penetrates the tilt shaft 138.

In the comparative example, the shaft center CL-2 of the tilt shaft 138 is not deviated from the shaft center CL-1 of the swivel shaft 136, and thus a large groove 138M is formed in order to secure a sufficient space for disposing the cable 54 in the groove 138M. In addition, the through hole 138H for communicating the groove 138M with the through hole 136H of the swivel shaft 136 is formed in the tilt shaft 138. Accordingly, a portion at which the cross section of the tilt shaft 138 is locally small is generated, deteriorating the strength of the tilt shaft 138. In addition, since the through hole 138H is formed in the tilt shaft 138, an amount of deviation of the tilt shaft 138 from the swivel shaft 136 is also limited.

On the other hand, the groove 38M of the tilt shaft 38 is formed in the horizontal direction of the tilt shaft 38 and the tilt shaft 38 can be disposed to be deviated from the swivel shaft 36 in the present embodiment. Accordingly, a space for disposing the cable 54 can be secured without forming the large groove 38M. Since the large groove 38M is not formed in the tilt shaft 38, reduction in the strength of the tilt shaft 38 can be prevented.

In addition, the groove 38M of the tilt shaft 38 is formed in the horizontal direction of the tilt shaft 38 in this manner and thus the tilt shaft 38 is deviated from the swivel shaft 36 in the present embodiment. Accordingly, it is possible to communicate the groove 38M with the through hole 36H of the swivel shaft 36 without forming a through hole in the tilt shaft 38 in the vertical direction. Since a through hole is not formed in the tilt shaft 38 in the vertical direction, reduction in the strength of the tilt shaft 38 can also be prevented in even this respect.

In addition, the groove 38M of the tilt shaft 38 is formed in the horizontal direction of the tilt shaft 38 and is connected to the through hole 36H of the swivel shaft 36 in the present embodiment. It is not necessary to form a through hole (refer to the through hole 138H shown in FIG. 10) that continues to the through hole 36H of the swivel shaft 36 with respect to the tilt shaft 38. Accordingly, the amount of deviation of the shaft center CL-2 of the tilt shaft 38 from the shaft center CL-1 of the swivel shaft 36 is less limited than in the structure of the comparative example.

The groove 38M has the supporting surface 38S. Since the supporting surface 38S supports the cable 54 disposed in the groove 38M from below, separation of the cable 54 from the groove 38M can be prevented.

The groove 38M has the holding piece 38H. Since the holding piece 38H holds the cable 54 disposed in the groove 38M from above, rising of the cable 54 from the groove 38M can be prevented.

The through hole 36H of the swivel shaft 36 and the groove 38M of the tilt shaft 38 are covered by the cover member 56. A space for disposing the cable 54 can be secured between the through hole 36H and the groove 38M and the cover member 56. In addition, it is possible to prevent separation and rising of the cable 54 and hold the cable 54 at a predetermined position according to the cover member 56. Particularly, in the present embodiment, the cable 54 is disposed in the groove 38M formed in the horizontal direction, and the cable 54 can be prevented from projecting from the groove 38M in the horizontal direction according to the cover member 56.

Since the cover member 56 covers the cable 54 disposed in the groove 38M, as shown in FIG. 9, a structure in which the cable 54 is not exposed from the computer 22 can be realized.

The through hole 36H of the swivel shaft 36 may be disposed at a position avoiding the shaft center CL-1. When the through hole 36H is formed at the shaft center CL-1, a movement range of the cable 54 disposed (inserted) in the through hole 36H can be reduced when the swivel shaft 36 rotates.

Although an embodiment of the technology disclosed in the present application has been described above, the technology disclosed in the present application is not limited to the above description and can be modified and embodied in various manners without departing from the spirit or scope of the present application.

What is claimed is:

1. A terminal device comprising:
    a main body housing;
    a display housing which includes a display and is configured to be superposed on an operation surface of the main body housing; and
    a hinge member which connects the main body housing to the display housing at a position of a first side of the main body housing,
    wherein the hinge member includes:
        a swivel shaft which intersects the operation surface of the main body housing and has a through hole in an axial direction;
        a tilt shaft which has a groove positioned continuously from the through hole and parallel to the operation surface, and is disposed so as to avoid the through hole of the swivel shaft; and
        a cable which electrically connects the main body housing to the display housing and is disposed in the through hole and the groove,
    wherein the groove has a supporting surface which supports the cable from below the cable and has a holding piece which holds the cable from above the cable, an opening of the groove is on a virtual plane that extends on an outer edge of the supporting surface and an outer edge of the holding piece, the virtual plane intersects the operation surface of the main body housing, the through hole is formed at a shaft center of the swivel shaft, and a shaft center of the tilt shaft is deviated from the opening of the groove in an opposite direction with respect to the shaft center of the swivel shaft.

2. The terminal device according to claim 1, comprising a cover member which covers the through hole and the groove.

3. The terminal device according to claim 1, wherein the tilt shaft has deviated to a position closer to the first side of the main body housing than the swivel shaft in a state in which the display is superposed on the operation surface.

4. The terminal device according to claim 3, wherein the display housing has an antenna provided on an opposite side of the tilt shaft.

5. The terminal device according to claim 4, wherein the antenna is disposed at a position at which it protrudes from the display housing when viewed in a normal direction of the operation surface in a state in which the display housing is superposed on the main body housing with the display being outside.

6. The terminal device according to claim 1, wherein the groove communicates with the through hole of the swivel shaft.

\* \* \* \* \*